(12) United States Patent
Berthe et al.

(10) Patent No.: US 8,562,782 B2
(45) Date of Patent: Oct. 22, 2013

(54) METHOD AND DEVICE FOR INTERLEAVING A MODULE OR CHIP

(75) Inventors: Benoit Berthe, Orleans (FR); Frederic Beulet, Meung sur Loire (FR); Sebastien Michenet, Saint Denis de l'Hotel (FR)

(73) Assignee: DataCard Corporation, Minnetonka, MN (US)

( * ) Notice: Subject to any disclaimer, the term of this patent is extended or adjusted under 35 U.S.C. 154(b) by 194 days.

(21) Appl. No.: 12/810,403

(22) PCT Filed: Dec. 16, 2008

(86) PCT No.: PCT/IB2008/003501
§ 371 (c)(1),
(2), (4) Date: Sep. 10, 2010

(87) PCT Pub. No.: WO2009/081251
PCT Pub. Date: Jul. 2, 2009

(65) Prior Publication Data
US 2010/0319845 A1 Dec. 23, 2010

(30) Foreign Application Priority Data
Dec. 26, 2007 (FR) ...................... 07 09107

(51) Int. Cl.
*B29C 65/00* (2006.01)
*B32B 37/00* (2006.01)
*B32B 38/04* (2006.01)

(52) U.S. Cl.
USPC ........... 156/256; 156/270; 156/293; 156/298; 156/299; 156/521; 156/517

(58) Field of Classification Search
USPC ......... 156/257, 264, 265, 268, 269, 270, 521, 156/519, 517, 293, 298, 299, 256
See application file for complete search history.

(56) References Cited

U.S. PATENT DOCUMENTS 5,397,426 A * 3/1995 Nioche et al. ................. 156/514
5,563,444 A * 10/1996 Leroux et al. ................. 257/679

(Continued)

FOREIGN PATENT DOCUMENTS

DE 42 24 994 A1 2/1994
EP 1 239 412 A 9/2002

(Continued)

OTHER PUBLICATIONS

International Search Report for application No. PCT/IB2008/003501, dated Apr. 6, 2009 (2 pages).

*Primary Examiner* — Linda L Gray
(74) *Attorney, Agent, or Firm* — Hamre, Schumann, Mueller & Larson, P.C.

(57) ABSTRACT

A method for interleaving a module including the cutting out of the module on a strip, the gripping of the cut-out module, the conveying of the module right up to a station for affixing and adhesively bonding modules. The module being heated by a heater via heat conduction of an affixing system upon conveying and then affixing of the preheated module by positioning the head of a first guiding member on the upper portion of a second guiding member forming a mask showing the imprint of the module or chip, preformed on the card, by displacement of the affixing system and of positioning the lower portion of the second guiding member on the surface of the card by displacement of the assembly formed by the affixing system and the second guiding member. A device for interleaving a module is also described.

15 Claims, 4 Drawing Sheets

(56) References Cited

U.S. PATENT DOCUMENTS

2004/0031570 A1* 2/2004 Kim et al. .................... 156/510
2004/0108582 A1* 6/2004 Kim et al. .................... 257/678
2008/0202677 A1* 8/2008 Ok ............................ 156/272.8

FOREIGN PATENT DOCUMENTS

EP          1 686 512 A        8/2006
WO         2004/100062 A      11/2004

* cited by examiner

METHOD AND DEVICE FOR INTERLEAVING A MODULE OR CHIP

The present invention relates to the field of chip cards and proposes a method and a device for interleaving of a module or chip.

Presently, chip cards have become inescapable communication objects, which may be easily used by anybody. This type of card includes at least one integrated circuit, i.e. a chip or module, capable of storing sensitive information or information giving access to services.

Presently, affixing and hot adhesive bonding of chips or modules on cards are achieved by means of varied technologies. One of these technologies consists of taking the chip or module by means of a specific tool and then of heating it by hot air conduction by means of a hot air blowing device, and finally affixing it on the card with another specific tool. But, the drawback of this technology is that it requires stops during the process for heating the chip, thereby causing a cycle time loss on the equipment.

Further, the major drawback of the different technologies is that with them accuracy cannot be ensured upon depositing the module on the plastic card.

The object of the present invention is to overcome one or more drawbacks of the prior art and to propose a method for interleaving a module or chip with which affixing of the module or chip on a plastic card in an accurate way and hot adhesive bonding of the module or chip on the plastic card may be ensured without impacting the module or chip while increasing productivity.

In order to attain this goal, the method for interleaving a module or chip comprises:
  a step for cutting out the module or chip on a strip;
  a step for gripping the cut-out module or chip by means of a gripping member of an affixing system;
  a step for conveying the module or chip right up to an affixing and adhesively bonding station for modules or chips, the module or chip being heated by heating means via heat conduction of the affixing system during said conveying step to a temperature causing the melting of the material on a card on which the module or chip is affixed or the melting of the adhesive positioned on the back of the chip or module;
  characterized in that a step for affixing the preheated module or chip consists of positioning the head of a first guiding member on the upper portion of a second guiding member, forming a mask showing the imprint of the chip or module preformed on the card, by displacement of the affixing system formed by the gripping member, the first guiding member and the heating means, and of positioning the lower portion of said guiding member on the surface of the card on which the module or chip is affixed, by displacement of the assembly formed by the affixing system and the second guiding member.

According to another particularity, the step for conveying the module or chip from a station for cutting out modules or chips right up to the station for affixing and adhesively bonding modules or chips consists of pivoting the interleaving device via control and driving means of the interleaving device so as to position the affixing system in the axis of the preformed imprint of the module or chip on the card.

According to another particularity, the step for gripping the module or chip on the strip consists of positioning the head of the first guiding member on the upper portion of a second guiding member, forming a mask showing the precut module or chip, by displacement of the affixing system formed by the gripping member, the first guiding member and the heating means, and positioning the lower portion of said second guiding member on the strip on which the module or chip is positioned, by displacement of the assembly formed by the affixing system and the second guiding member.

According to another particularity, a step for pivoting the affixing system in order to affix the module or chip in a suitable direction on the card is provided before the step for affixing the module or chip, in the case when the modules or chips are positioned on the strip in a direction requiring rotation of the affixing system.

The object of the present invention is also to overcome one or more drawbacks of the prior art by proposing a device for interleaving a module or chip with which the method for interleaving a module or chip may be applied simply and with a low cost.

This goal is achieved by means of a device for interleaving a module or chip with which the interleaving method may be applied, characterized in that it comprises an affixing system mounted on an attachment unit of the interleaving device and means for driving and controlling the affixing system, intended to control the affixing system on the one hand, and to pivot the affixing system between a station for cutting out the modules or chips and a station for affixing and adhesively bonding the modules or chips on a card on the other hand, the affixing system comprising a gripping member intended for gripping, by means of a suction system, the module or chip cut-out by a cutting out system of the station for cutting out modules or chips and then for maintaining the module or chip in a recess formed in the head of the affixing system during its conveying from the station for cutting out modules or chips right up to the station for affixing and adhesively bonding modules or chips and after guiding of the gripping member, by means of guiding members, for accurately affixing the module or chip heated beforehand via heat conduction, in the preformed imprint of the module or chip on the card, the heating by heat conduction of the module or chip being provided by heating means of the affixing system and achieved during the conveying of the module or chip from the station for cutting out the modules or chips right up to the station for affixing and adhesively bonding the modules or chips and with this, the adhesive bonding of the module or chip in the preformed imprint of the module or chip on the card may be ensured.

According to another particularity, the affixing system with an axis of symmetry perpendicular to the direction of displacement of the cards positioned on the moving device and to the direction of displacement of the strip containing the modules or chips includes a first guiding member formed by a bore, the section of which is of sufficient dimensions in order to receive the gripping member and the heating means by heat conduction of the gripping member, without the heating means and the gripping member being in contact with the first guiding member, the bore of the first guiding member ending with a shrinkage of its section forming the recess for the module or chip and intended to guide the head of the gripping member.

According to another particularity, the gripping member has a section corresponding to the characteristic shape of the module or chip and is heated by heating means via heat conduction, positioned on the side surface of the gripping member in proximity to the head of the gripping member maintaining the module or chip, for heating by heat conduction the module or chip to a temperature substantially above a temperature threshold causing the melting of the constitutive material of the card or of the adhesive positioned on the back of the module or chip.

According to another particularity, the gripping member is able to move along an axis parallel to the axis of symmetry of the affixing system independently of the assembly formed by the first guiding member and the heating means, for performing operations for gripping the module or chip and operations for affixing the module or chip on the card.

According to another particularity, the gripping member, the first guiding member and the heating means form a one-piece part able to be controlled by means for driving and controlling the interleaving device for performing gripping, heating and interleaving operations on modules or chips and for conveying the module or chip between the station for cutting out the modules or chips and the station for affixing and adhesively bonding modules or chips on a card.

According to another particularity, the one-piece part is capable of moving along an axis parallel to the axis of symmetry of the affixing system in order to perform operations for gripping the module or chip and operations for affixing the module or chip on the card and to pivot around the axis of symmetry of the affixing system in order to affix the module or chip in a suitable direction in the preformed imprint of the module or chip on the card.

According to another particularity, a second guiding member forming a mask showing the cut-out module or chip and another second guiding member forming a mask showing the preformed imprint of the chip or module on the card, are independent of the one-piece part and include an upper portion able to receive the head of the first guiding member of the affixing system, a bore, the section of which has the shape and dimensions of the module or chip, for accurately guiding the head of the gripping member and a lower portion either able to come into contact with the surface of the card on which the module or chip is affixed and adhesively bonded or for the other second guiding member, able to come into contact with the strip on which the precut module or chip is positioned.

According to another particularity, the second guiding members are capable of moving along an axis parallel to the axis of symmetry of the affixing system in order to accompany the displacement of the one-piece part until the lower portion of the second guiding member, which is not heat conducting, enters into contact either with the surface of the card on which the module or chip is affixed or with the strip on which the precut module or chip is positioned.

According to another particularity, the attachment unit on which the affixing system is attached is driven by the means for driving the interleaving device, with which it is possible to pivot either the interleaving device for conveying the module or chip by means of the affixing system of the station for cutting out the modules or chips, right up to the station for affixing and adhesively bonding the modules or chips, or the interleaving device for conveying the module or chip by means of the affixing system of the station for cutting out the modules or chips, right up to the station for affixing and adhesively bonding the modules or chips and then the affixing system for affixing in a suitable direction, the module or chip in the preformed imprint of the module or chip on the card.

According to another particularity, the card consists of plastic type material and includes the imprint able to receive the module or chip by means of the affixing system, the whole of the cards with imprint being positioned on a moving device of the modules or chips so that each card is conveyed to the station for affixing and adhesively bonding modules or chips and then sent towards another station once the module or chip is affixed and adhesively bonded in the preformed imprint of the module or chip on the card.

According to another particularity, the modules or chips with a characteristic shape are positioned, either in one direction or in another direction requiring that rotation of the affixing system be performed, on a moving strip so that the contour of each module or chip is cut-out from the strip by a cutting out system of the station for cutting out the modules or chips.

The invention will be better understood and other objects, characteristics, details and advantages thereof will become more clearly apparent during the explanatory description which follows, made with reference to the appended drawings, given as non-limiting examples wherein.

Figure 1:
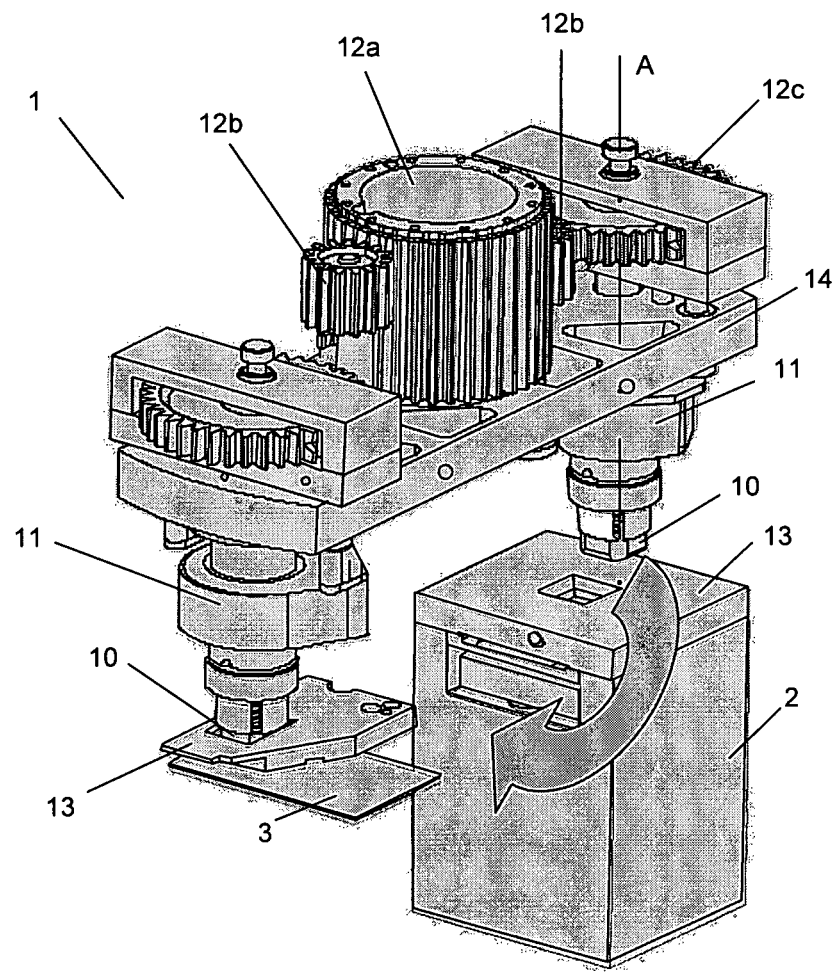
FIG. 1 illustrates the device for interleaving a module or chip.

The invention will now be described with reference to the aforementioned figures.

The present invention consists of affixing and adhesively bonding, accurately, a module or chip (4) into a preformed imprint (30) on a card (3).

The device (1) for interleaving a module or chip (4) includes an affixing system (10) and means for driving and controlling the affixing system (10) intended for controlling the affixing system (10) on the one hand, and for pivoting the affixing system (10) between a station for cutting out the modules or chips and a station for affixing and adhesively bonding the modules or chips on a card (3) on the other hand. The affixing system (10) comprises a gripping member (100) intended for gripping (1001) by means of a suction system, the module or chip (4) cut-out by a cutting out system (2) of the station for cutting out modules or chips and then for maintaining the module or chip (4) in a recess formed in the head of the affixing system (10) during its conveying (1002) from the station for cutting out modules or chips right up to the station for affixing and adhesively bonding modules or chips and after guiding of the gripping member (100), by means of the guiding members (101, 13), for accurately affixing (1003) the module or chip (4) heated beforehand via heat conduction, in the preformed imprint (30) of the module or chip (4) on the card (3). The heating via heat conduction of the module or chip (4) is achieved during conveying (1002) of the module or chip (4) from the station for cutting out modules or chips right up to the station for affixing and adhesively bonding modules or chips, and with this, adhesive bonding of the module or chip (4) into the preformed imprint (30) on the card (3) may be ensured.

The card (3) consists of a plastic type material and includes on one of these large size faces, at a suitable location, the imprint (30) with a centre of symmetry (O), able to receive the module or chip (4) by means of the affixing system (10). The whole of the cards (3) with the imprint (30) is positioned on a device for moving the modules or chips, for example a belt conveyor, so that each card (3) is conveyed to the station for affixing and adhesively bonding the modules or chips and then sent towards a station or device for electronic or graphical customization of the cards (3) once the module or chip (4) is affixed and adhesively bonded in the preformed imprint (30) on the card (3).

The modules or chips (4) of a characteristic shape are positioned, either in one direction or in one other direction requiring that rotation by a half-circle of the affixing system (10) be performed, on a moving strip so that each module or chip (4) of the strip is positioned on the cutting out system (2) of the station for cutting out modules or chips so that the contour of each module or chip (4) is cut-out from below by the cutting out system (2), for example and in a non-limiting way, a punch.

The affixing system (10) with an axis of symmetry (Δ) perpendicular to the direction of displacement of the cards (3) with imprints (30) positioned on the moving device and in the direction of displacement of the strip containing the modules or chips (4) includes a first guiding member (101) formed by a bore, the section of which is of sufficient dimensions for receiving the gripping member (100) and means (102) for heating via heat conduction of the gripping member (100), without the heating means (102) and the gripping member (100) being in direct contact with the internal walls of the first guiding member (101). The bore of the first guiding member (101) ends with a shrinkage of its section forming a recess for the module or chip (4) and intended for guiding the head of the member (100) for gripping the module or chip (4). Consequently, the shrinkage of the section of the first guiding member (101) corresponds to the characteristic shape of the module or chip (4).

Further, the affixing system (10) includes the member (100) for gripping the module or chip (4), the section of which corresponds to the characteristic shape of the module or chip (4). The gripping member (100) consists of metal material and is heated by heating means (102) via heat conduction positioned on the side surface of the gripping member (100) in proximity to the head of the gripping member (100) maintaining the module or chip (4). The heating means (102) via heat conduction, for example and in a non-limiting way, are a heating resistor positioned around the gripping member (100) without any direct contact with the first guiding member (101). Advantageously, the gripping member (100) is able to heat via heat conduction the module or chip (4) maintained by the head of the gripping member (100) to a temperature substantially above a temperature threshold causing the melting of the constitutive material of the card (3) or of the adhesive positioned on the back of the module or chip (4). Advantageously, the module or chip (4) heated beforehand and affixed in the preformed imprint (30) on the card (3) by means of the gripping member (100) causes the melting of the material of the card (3), the plastic in the illustrated example, or the melting of the adhesive positioned on the back of the module or chip (4). During the cooling, the material of the card (3) or the adhesive solidifies thereby causing bonding of the module or chip (4) into the preformed imprint (30) on the card (3).

The gripping member (100) of the affixing system (10) further includes a suction means for example and in a non-limiting way, a suction hole, connected to a suction system of the interleaving device (1) for gripping the module or chip (4), cut-out beforehand by the cutting out system (2) of the station for cutting out modules or chips, on the strip.

The gripping member (100), the first guiding member (101) and the heating means (102) form a one-piece part able to be controlled by the means for driving and controlling the interleaving device (1) for performing gripping, heating and interleaving operations on modules or chips (4) and for conveying the module or chip (4) between the station for cutting out the modules or chips, and the station for affixing and adhesively bonding modules or chips on a card (3). This one-piece part (10) formed by the gripping member (100), the first guiding member (101) and the heating means (102) are fixedly mounted on an attachment unit (11) of the interleaving device (1). The interleaving device will be described subsequently in the description.

The one-piece part (10), further called the affixing system (10), formed by the first guiding member (101), the gripping member (100) and the heating means (102) is able to move along an axis parallel to the axis of symmetry (Δ) of the affixing system (10) for the operation for gripping (1001) the module or chip (4) and the operation for affixing (1003) the module or chip (4) on the card (3), and to pivot by a half-circle around the axis of symmetry (Δ) of the affixing system (10) for affixing the module or chip (4) in a suitable direction in the preformed imprint (30) on the card (3). Further, the gripping member (100) is able to move along an axis parallel to the axis of symmetry (Δ) of the affixing system (10) independently of the assembly formed by the first guiding member (101) and the heating means (102) for the operation (1001) for gripping the module or chip (4) and for the operation (1003) for affixing the module or chip (4) on the card (3).

Further, a second guiding member (13) forming a mask showing the cut-out module or chip (4) and another second guiding member (13) forming a mask showing the preformed imprint (30) of the module or chip (4) on the card (3) are independent of the one-piece part (10) formed by the gripping member (100), the first guiding member (101) and the heating means (102). The second guiding member (13), forming a mask showing the preformed imprint (30) of the module or chip (4) on the card (3), as a cup, includes an upper portion (13a) able to receive the head of the first guiding member (101) of the affixing system (10), a bore (13b), the section of which has the shape and dimensions of the module or chip (4), for accurately guiding the head of the member (100) for gripping the module or chip (4) and a lower portion (13c) able to come into contact with the surface of the card (3) on which the module or chip (4) is affixed and adhesively bonded. The second guiding member (13) forming a mask showing the preformed imprint (30) of the module or chip (4) on the card (3), is capable of moving along an axis parallel to the axis of symmetry (Δ) of the affixing system (10) in order to accompany the displacement of the one-piece part (10) until the lower portion (13c) of the second guiding member (13) comes into contact with the surface of the card (3) onto which the module or chip (4) is affixed.

The other second guiding member (13), forming a mask showing the cut-out module or chip (4), as a cup, includes an upper portion (13a) able to receive the head of the first guiding member (101) of the affixing system (10), a bore (13b), the section of which has the shape and dimensions of the module or chip (4) in order to accurately guide the head of the member (100), for gripping the module or chip (4) and a lower portion (13c) able to come into contact with the strip on which the module or chip (4) is positioned. The other second guiding member (13) forming a mask showing the cut-out module or chip (4), is capable of moving along an axis parallel to the axis of symmetry (Δ) of the affixing system (10) in order to accompany the displacement of the one-piece part (10) until the lower portion (13c) of the second guiding member (13) comes into contact with the strip on which the module or chip (4) is positioned.

It should be noted that the first guiding member (101) consists of a heat conducting metal material. Therefore, upon heating via heat conduction the gripping member (100) and therefore the module or chip (4), the first guiding member (101) is also heated via heat conduction. In this way, the one-piece part (10) formed by the gripping member (100), the first guiding member (101) and the heating means (102) is at a temperature causing the melting of the material of the card (3) or of the adhesive positioned on the back of the module or chip (4) and therefore cannot come into direct contact with the surface of the card (3) onto which the module or chip (4) is affixed.

The second guiding member (13) forming a mask showing the preformed imprint (30) of the module or chip (4) on the card (3) and used for guiding the gripping member (100) is independent of the one-piece part (10) and consists of a non-heat-conducting material and therefore is at a temperature which does not cause the melting of the material of the card (3) or of the adhesive positioned on the back of the module or chip (4). Advantageously, the second guiding member (13) forming a mask, showing the preformed imprint (30) of the module or chip (4) on the card (3), with which accurate adhesive bonding of the module or chip (4) in the preformed imprint (30) on the card (3) may be ensured without any impact on the module or chip (4).

Now, we shall describe the device (1) for interleaving a module or a chip (4).

The affixing system (10) described earlier is thus attached on an attachment unit (11) of the stand-alone interleaving device (1).

With reference to FIG. 1, the device (1) for interleaving a module or chip (4) comprises means for driving and controlling the affixing system (10) attached on the attachment unit (11).

The attachment unit (11) on which the affixing system (10) is attached, is driven by the driving means of the interleaving device (1), for example and in a non-limiting way, a gear train for pivoting by a half-circle either exclusively the interleaving device (1) for conveying the module or chip (4) by means of the affixing system (10) from the station for cutting out the modules or chips right up to the station for affixing and adhesively bonding the modules or chips, or the interleaving device (1) for conveying the module or chip (4) by means of the affixing system (10) of the station for cutting out the modules or chips right up to the station for affixing and adhesively bonding the modules or chips, and then the affixing system (10) for affixing in a suitable direction the module or chip (4) into the preformed imprint (30) on the card (3). In the example illustrated in FIG. 1, the attachment unit (11) is mounted on a driving crown (12c) which may be meshed with an internal cog (12b), this internal cog (12b) being able to mesh with a driving wheel (12a). The driving crown (12c), the internal cog (12b) and the driving wheel (12a) forms the gear train on the interleaving device (1). When the internal cog (12b) is caused to face the driving crown (12c) on which the attachment unit (11) is mounted, the head of the affixing system (10) formed by the gripping member (100), the first guiding member (101) and the heating means (102) performs a half-turn around the axis of rotation (A) in order to allow the module or chip (4) to be affixed in a suitable direction in the preformed imprint (30) on the card (3). When the driving wheel (12a) integral with a platform (14) of the interleaving device (1) performs a half-turn, the affixing system (10) of the interleaving device (1) is brought from the station for cutting out the modules or chips, right up to the station for affixing and adhesively bonding modules or chips. When the internal cog (12b) does not mesh between the driving wheel (12a) and the driving crown (12c), the affixing system (10) does not rotate on itself.

The affixing system (10) is controlled by the control means of the interleaving device (1), for example and in a non-limiting way, a control cabinet receiving a control program from the affixing system (10).

We shall now describe the method for interleaving a module or chip (4).

Figure 2:
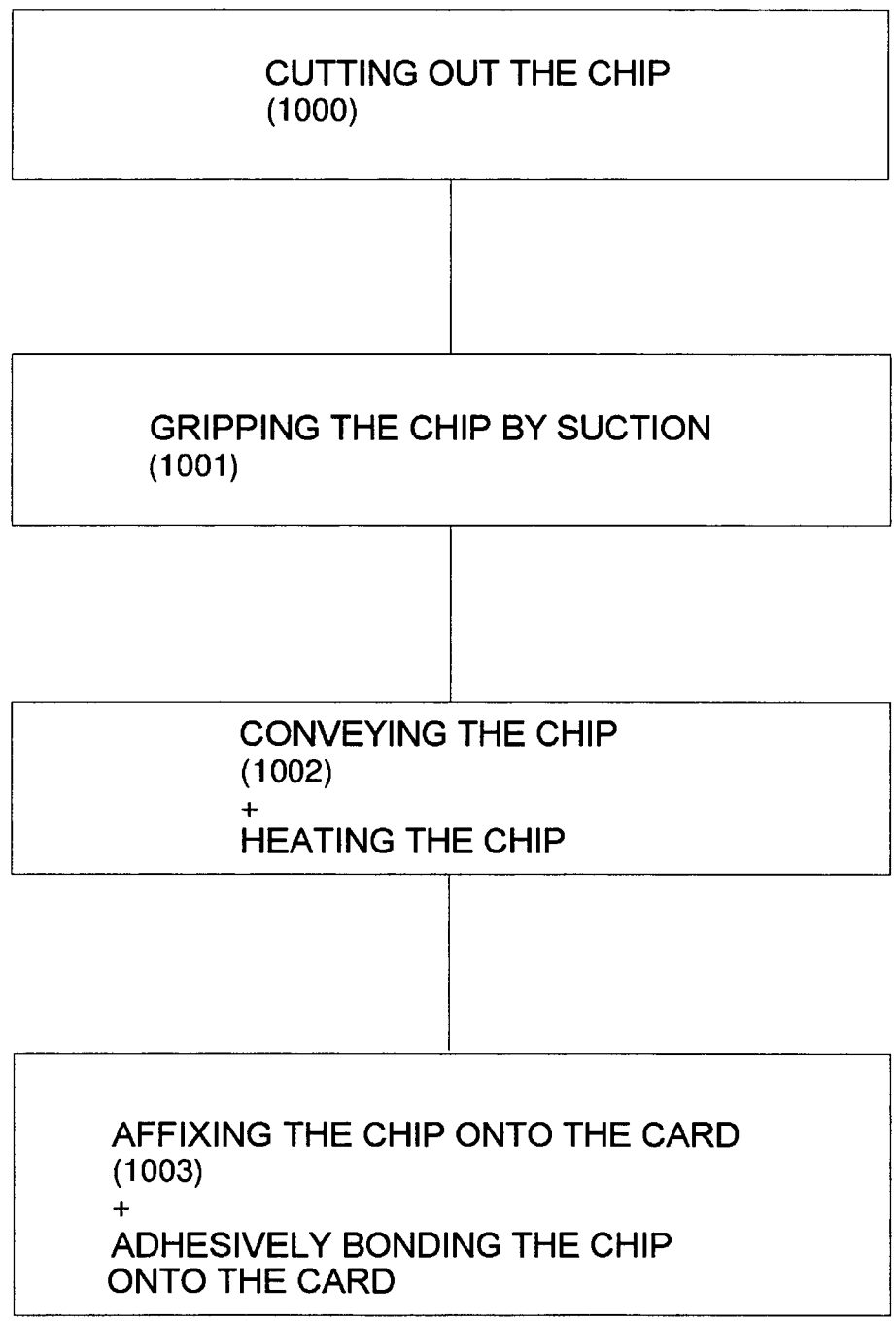
FIG. 2 illustrates the method for interleaving a module or chip.

With reference to FIG. 2, the method for interleaving a module or chip (4) comprises:

a step (1000) for cutting out a module or chip (4) on a strip by means of the cutting out system (2) of the station for cutting out modules or chips;

a step (1001) for gripping by suction the cut-out module or chip by means of the gripping member (100) guided by the guiding members (101, 13);

a step (1002) for conveying the module or chip (4), into the recess formed in the head of the affixing system (10), from the station for cutting out modules or chips right up to the station for affixing and adhesively bonding modules or chips, the module or chip (4) being heated by the heating means (102) via heat conduction of the affixing system (10) during this conveying step (1002) to a temperature causing the melting of the material of the card (3) on which the module or chip (4) is affixed or the melting of the adhesive positioned on the back of the module or chip (4);

a step (1003) for affixing the preheated module or chip (4) into the preformed imprint (30) of the module or chip (4) on the card (3) by means of the affixing system (10) and of the second guiding member (13), the adhesive bonding of the affixed module or chip (4) in the preformed imprint (30) on the card (3) being achieved by melting and solidification of the constitutive material of the card (3) or of the adhesive positioned on the back of the module or chip (4) by means of the temperature of the module or chip (4).

The step (1001) for gripping the module of chip (4) on the strip consists of positioning the head of the first guiding member (101) on the upper portion (13a) of the other second guiding member (13) forming the mask showing the precut module or chip (4) by displacement of the affixing system (10) formed by the gripping member (100), the first guiding member (101) and the heating means (102) along an axis parallel to the axis of symmetry (Δ) of the affixing system (10) and of positioning the lower portion (13c) of the other second guiding member (13), forming the mask showing the precut module or chip (4), on the strip on which the module or chip (3) is positioned, by displacement of the assembly formed by the one-piece part (10) and the second guiding member (13) along an axis parallel to the axis of symmetry (Δ) of the affixing system (10) so that the gripping member (100) is positioned for gripping the module or chip (4) on the strip.

Figure 3:
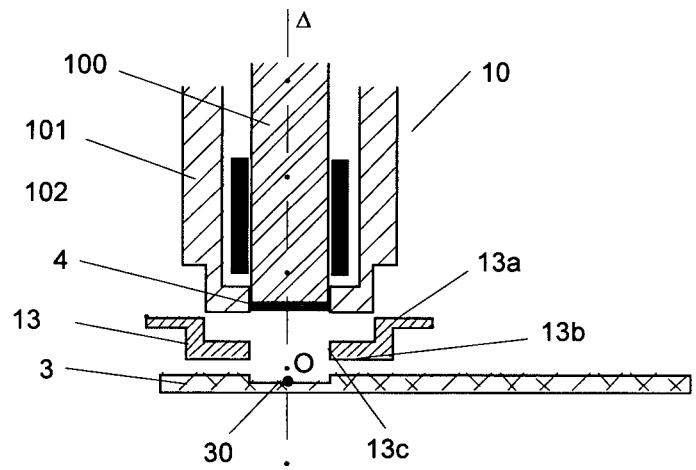
FIG. 3 illustrates the system for affixing a module or chip on a card during the step for preheating a module or chip via the heating means of the affixing system.

The step (1002) for conveying the module or chip (4) from the station for cutting out modules or chips right up to the station for affixing and adhesively bonding modules or chips consists of pivoting by a half-circle, the interleaving device (1) via the gear train of the interleaving device (1) so as to position the axis of symmetry (Δ) of the affixing system (10) in the axis of the centre (O) of symmetry of the preformed imprint (30) on the card (3), as illustrated in FIG. 3.

It should be noted that the affixing system (10) may also pivot by a half-circle, around the axis of symmetry (Δ) of the affixing system (10), so that the affixing system (10) affixes the module or chip (4) in a suitable direction on the card (3).

Once the axis of symmetry (Δ) of the affixing system (10) is positioned in the axis of the centre (O) of symmetry of the preformed imprint (30) on the card (3), as illustrated in FIG. 3, the step (1003) for affixing the preheated module or chip (4) begins and takes place as follows.

Figure 4:
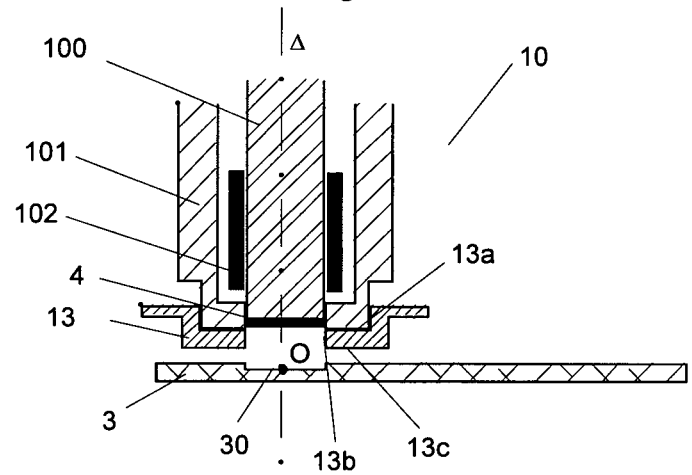
FIG. 4 illustrates the system for affixing a module or chip on a card when the upper portion of the second guiding member receives the head of the affixing system.

The head of the first guiding member (101) will be positioned on the upper portion (13a) of the second guiding member (13) forming the mask showing the preformed imprint (30) on the card (3), as illustrated in FIG. 4, by displacement of the one-piece part (10) formed by the gripping member (100), the first guiding member (101) and the heating means (102) according to the axis of symmetry (Δ) of the affixing system (10).

Figure 5:
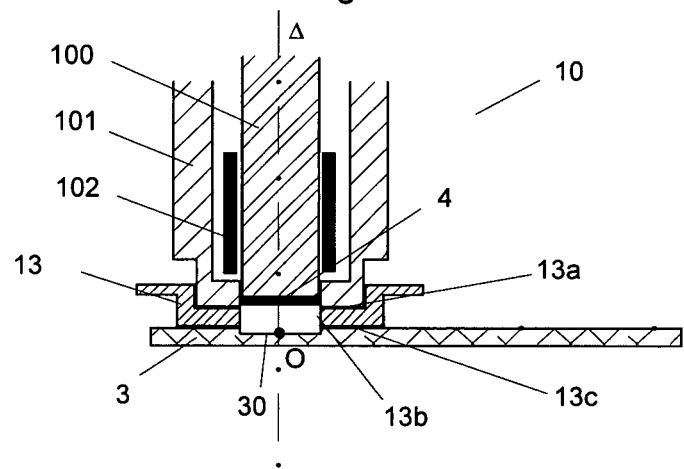
FIG. 5 illustrates the system for affixing a module or chip on a card when the lower portion of the second guiding member is in contact with the surface of the card on which the module or chip is affixed.
Figure 6:
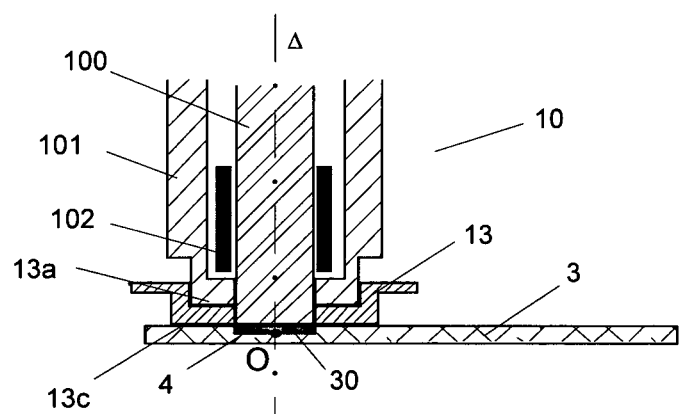
FIG. 6 illustrates the system for affixing a module or chip on a card during the step for affixing a module or chip in the preformed imprint of the module or chip on a card by means of the gripping member of the affixing system.

The lower portion (13c) of the second guiding member (13) forming the mask showing the preformed imprint (30) on the card (3) will be positioned on the surface of the card (3) on which the module or chip (4) is affixed, as illustrated in FIG. 5, by displacement of the assembly formed by the one-piece part (10) and the second guiding member (13) along the axis of symmetry (Δ) of the affixing system (10) so that the gripping member (100) is positioned in order to affix the module or chip (4) into the preformed imprint (30) on the card (3) while being guided by the first and second guiding members (101, 13), as illustrated in FIG. 6.

Once the module or chip (4) is preheated and affixed into the preformed imprint (30) on the card (3), the module or chip (4) is adhesively bonded by melting and next by solidification of the material of the card (3) or of the adhesive positioned on the back of the module or chip (4), the melting of the material of the card (3) or the adhesive being due to the temperature of the module or chip (4) obtained by preheating during the step (1002) for conveying the module or chip (4).

Figure 7:
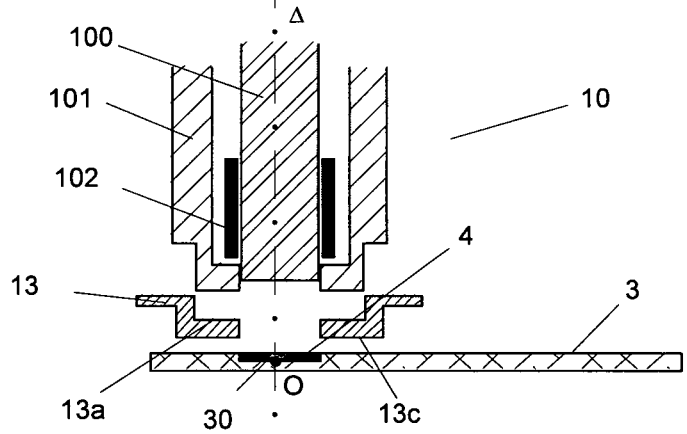
FIG. 7 illustrates the system for affixing a module or chip after affixing and adhesively bonding the module or chip in the preformed imprint of the module or chip on the card.

The affixing system (10) and the second guiding member (13) forming the mask showing the preformed imprint (30) on the card (3) again find their initial position, illustrated in FIG. 7 by displacement along the axis of symmetry (Δ) of the affixing system (10) and of the second guiding member (13).

One of the advantages of the invention is that with the method for interleaving a module or chip (4), the affixing and adhesive bonding of a module or chip (4) in the preformed imprint (30) of a module or chip (4) on a card (3) may be ensured accurately without any impact on the module or chip (4).

It should be obvious for one skilled in the art that the present invention allows embodiments in many other specific forms without departing from the field of application of the invention as claimed. Therefore, the present embodiments should be considered as an illustration, but may be modified in the field defined by the scope of the appended claims, and the invention should not be limited to the details given above.

The invention claimed is:

1. A method for interleaving a module or chip comprising:
a step of cutting out the module or chip on a strip;
a step of gripping the cut-out module or chip by means of a gripping member of an affixing system;
a step of conveying the module or chip right up to a station for affixing and adhesively bonding modules or chips, the module or chip being heated by heating means via heat conduction of the affixing system during said conveying step to a temperature causing the melting of the material of a card on which the module or chip is affixed, or the melting of an adhesive positioned on the back of the module or chip;
further comprising a step of affixing the preheated module or chip which includes positioning a head of a first guiding member on an upper portion of a second guiding member, forming a mask showing an imprint of the chip or module, preformed on the card, by displacement of the affixing system formed by the gripping member, the first guiding member and the heating means and positioning a lower portion of said second guiding member on the surface of the card on which the module or chip is affixed, by displacement of the assembly formed by the affixing system and the second guiding member.

2. The interleaving method according to claim 1, wherein the step of conveying the module or chip from a station for cutting out modules or chips right up to the station for affixing and adhesively bonding modules or chips, includes pivoting the interleaving device via means for controlling and driving the interleaving device so as to position the affixing system in the axis of the imprint of the module or chip on the card.

3. The interleaving method according to claim 1, wherein the step of gripping the module or chip on the strip includes positioning the head of the first guiding member on the upper portion of a second guiding member, forming a mask showing the precut module or chip by displacement of the affixing system formed by the gripping member, the first guiding member and the heating means and of positioning the lower portion of said second guiding member on the strip on which the module or chip is positioned by displacement of the assembly formed by the affixing system and the second guiding member.

4. The interleaving method according to claim 1, wherein a step of pivoting the affixing system in order to affix the module or chip in a suitable direction on the card is provided before the step of affixing the module or chip in the case when the modules or chips are positioned on the strip in a direction requiring rotation of the affixing system.

5. A device for interleaving a module or chip, comprising an affixing system mounted on an attachment unit of the interleaving device and means for driving and controlling the affixing system intended to control the affixing system on the one hand and to pivot the affixing system on the other hand between a station for cutting out the modules or chips and a station for affixing and adhesively bonding the modules or chips on a card, the affixing system comprising a gripping member intended to grip, by means of a suction system, the module or chip cut-out by a cutting out system of the station for cutting out modules or chips and then maintaining the module or chip in a recess formed in a head of the affixing system during its conveying from the station for cutting out the modules or chips right up to the station for affixing and adhesively bonding the modules or chips and after guiding the gripping member by means of guiding members, accurately affixing the module or chip heated beforehand via heat conduction, into the preformed imprint of the module or chip on the card, the heating via heat conduction of the module or chip being ensured by heating means of the affixing system and achieved during the conveying of the module or chip from the station for cutting out the modules or chips right up to the station for affixing and adhesively bonding the modules or chips and with which adhesive bonding of the module or chip into the preformed imprint of the module or chip on the card may be ensured.

6. The interleaving device according to claim 5, wherein, the cards being displaced along a direction referred to as a direction of displacement of the cards, strips containing the modules or chips being displaced along a direction referred to as a direction of displacement of the strips containing the modules or chips, the affixing system has an axis of symmetry (Δ) perpendicular to the direction of displacement of the cards positioned on a moving device and to the direction of displacement of the strip containing the modules or chips, a first guiding member of the guiding members being formed by a bore, the section of which has sufficient dimensions for receiving the gripping member and the heating means, without the heating means and the gripping member being in contact with the first guiding member, the bore of the first guiding member ending with a shrinkage of its section forming the recess for the module or chip and intended to guide a head of the gripping member.

7. The interleaving device according to claim 5, wherein the gripping member has a section corresponding to the characteristic shape of the module or chip and is heated by heating means via heat conduction, positioned at the side surface of the gripping member in proximity to a head of the gripping member maintaining the module or chip, for heating via heat conduction, the module or chip to a temperature substantially above a temperature threshold causing melting of the constitutive material of the card or of adhesive positioned on the back of the module or chip.

8. The interleaving device according to claim 6, wherein the gripping member is able to move along an axis parallel to the axis of symmetry ($\Delta$) of the affixing system independently of the assembly formed by the first guiding member and the heating means, in order to perform operations for gripping the module or chip and operations for affixing the module or chip onto the card.

9. The interleaving device according to claim 6, wherein the gripping member, the first guiding member and the heating members form a one-piece part able to be controlled by the means for driving and controlling the interleaving device, in order to perform operations for gripping, heating and interleaving modules or chips and for conveying the module or chip between the station for cutting out modules or chips and the station for affixing and adhesively bonding modules or chips on a card.

10. The interleaving device according to claim 9, wherein the one-piece part is able to move along an axis parallel to the axis of symmetry ($\Delta$) of the affixing system in order to perform operations for gripping the module or chip and operations for affixing the module or chip on the card and to pivot around the axis of symmetry ($\Delta$) of the affixing system in order to affix the module or chip in a suitable direction in the preformed imprint of the module or chip on the card.

11. The interleaving device according to claim 9, wherein a second guiding member of the guiding members forming a mask of the guiding members forming a mask showing the preformed imprint of the module or chip on the card, are independent of the one-piece part and include an upper portion able to receive the head of the first guiding member of the affixing system, a bore, the section of which has the shape and dimensions of the module or chip, for accurately guiding the head of the gripping member and a lower portion either able to come into contact with the surface of the card on which the module or chip is affixed and adhesively bonded, or for the other guiding member, able to come into contact with a strip on which the precut module or chip is positioned.

12. The interleaving device according to claim 11, wherein the second guiding members are capable of moving along an axis parallel to the axis of symmetry ($\Delta$) of the affixing system in order to accompany the displacement of the one-piece part until the lower portion of a non-heat-conducting guiding member of the second guiding members comes into contact either with the surface of the card on which the module or chip is affixed, or with the strip on which the precut module or chip is positioned.

13. The interleaving device according to claim 5, wherein the attachment unit on which the affixing device is attached, is driven by the driving means of the interleaving device with which it is possible to pivot either the interleaving device for conveying the module or chip by means of the affixing system from the station for cutting out the modules or chips right up to the station for affixing and adhesively bonding the modules or chips, or the interleaving device for conveying the module or chip by means of the affixing system from the station for cutting out the modules or chips right up to the station for affixing and adhesively bonding the modifies or chips and next the affixing system in order to affix in a suitable direction, the module or chip into the preformed imprint of the module or chip on the card.

14. The interleaving device according to claim 5, wherein the card comprises a plastic type material and includes the imprint able to receive the module or chip by means of the affixing system, the whole of the cards with the imprint being positioned on a moving device of the modules or chips so that each card is conveyed to the station for affixing and adhesively bonding the modules or chips and then sent towards another station once the module or chip is affixed and adhesively bonded in the preformed imprint of the module or chip on the card.

15. The interleaving device according to claim 5, wherein the modules or chips with a characteristic shape are positioned, either in one direction or in another direction requiring that rotation of the affixing system be performed, on a moving strip so that the contour of each module or chip is cut-out from the moving strip by a cutting out system of the station for cutting out the modules or chips.

* * * * *